United States Patent
Skiba-Szymanska et al.

(10) Patent No.: US 8,461,569 B2
(45) Date of Patent: Jun. 11, 2013

(54) SEMICONDUCTOR DEVICE AND A METHOD OF FABRICATING A SEMICONDUCTOR DEVICE

(75) Inventors: Joanna Krystyna Skiba-Szymanska, Cambridge (GB); Andrew James Shields, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 13/104,368

(22) Filed: May 10, 2011

(65) Prior Publication Data

US 2011/0272671 A1     Nov. 10, 2011

(30) Foreign Application Priority Data

May 10, 2010   (GB) .................................. 1007802.0

(51) Int. Cl.
*H01L 29/06*   (2006.01)

(52) U.S. Cl.
USPC .................. 257/14; 257/E29.07; 257/E21.09; 257/E33.005; 257/E33.013; 438/22; 438/478

(58) Field of Classification Search
USPC .......................................................... 257/14
See application file for complete search history.

(56) References Cited

U.S. PATENT DOCUMENTS

| | | | | |
|---|---|---|---|---|
| 4,759,023 A | * | 7/1988 | Yamaguchi | 438/23 |
| 5,293,050 A | * | 3/1994 | Chapple-Sokol et al. | 257/17 |
| 5,406,094 A | * | 4/1995 | Arimoto et al. | 257/24 |
| 5,654,557 A | * | 8/1997 | Taneya et al. | 257/14 |
| 5,703,896 A | * | 12/1997 | Pankove et al. | 372/50.23 |
| 6,011,271 A | * | 1/2000 | Sakuma et al. | 257/14 |
| 6,023,485 A | * | 2/2000 | Claisse et al. | 372/50.21 |
| 6,235,547 B1 | * | 5/2001 | Sakuma et al. | 438/44 |
| 6,239,449 B1 | * | 5/2001 | Fafard et al. | 257/17 |
| 6,297,063 B1 | * | 10/2001 | Brown et al. | 438/2 |
| 6,507,042 B1 | * | 1/2003 | Mukai et al. | 257/14 |
| 6,518,194 B2 | * | 2/2003 | Winningham et al. | 438/717 |
| 6,583,436 B2 | * | 6/2003 | Petroff et al. | 257/18 |
| 6,667,196 B2 | * | 12/2003 | Yu et al. | 438/142 |
| 6,753,593 B1 | * | 6/2004 | Jefferson et al. | 257/627 |

(Continued)

FOREIGN PATENT DOCUMENTS

| | | |
|---|---|---|
| EP | 0 851 506 A2 | 7/1998 |
| EP | 0 851 506 A3 | 7/1998 |

(Continued)

OTHER PUBLICATIONS

T. J. Pfau, et al, "Site-controlled InAs quantum dots grown on a 55 nm thick GaAs buffer layer", Applied Physics Letters 95, 243106, 2009, 3 pages.

(Continued)

*Primary Examiner* — Kyoung Lee
*Assistant Examiner* — Ankush Singal
(74) *Attorney, Agent, or Firm* — Oblon, Spivak, McClelland, Maier & Neustadt, L.L.P.

(57) ABSTRACT

A semiconductor device includes a quantum dot and a plurality of layers, wherein said plurality of layers includes: a first layer; a stressor layer; and a patterned layer wherein said stressor layer overlies said first layer and said patterned layer overlies said stressor layer; wherein said stressor layer has a substantially different lattice constant to said first layer and said patterned layer and has a pit provided in said layer; said quantum dot lying above said patterned layer aligned with said pit.

20 Claims, 6 Drawing Sheets

U.S. PATENT DOCUMENTS

| | | | |
|---|---|---|---|
| 6,815,242 B2* | 11/2004 | Mukai et al. | 438/47 |
| 6,862,312 B2* | 3/2005 | Fafard | 372/71 |
| 6,885,023 B2* | 4/2005 | Shields et al. | 257/21 |
| 6,906,326 B2* | 6/2005 | Koch et al. | 250/338.4 |
| 6,914,256 B2* | 7/2005 | Zhang et al. | 257/15 |
| 7,324,574 B2* | 1/2008 | Kim | 372/50.21 |
| 7,425,296 B2* | 9/2008 | Cochran et al. | 264/458 |
| 7,432,187 B1* | 10/2008 | Cok | 438/609 |
| 7,465,595 B2* | 12/2008 | Song et al. | 438/46 |
| 7,525,245 B2* | 4/2009 | Tamura et al. | 313/495 |
| 7,535,034 B2* | 5/2009 | Walter et al. | 257/197 |
| 7,535,170 B2* | 5/2009 | Fujii | 313/506 |
| 7,555,027 B2* | 6/2009 | Kovsh et al. | 372/50.11 |
| 7,618,905 B1* | 11/2009 | Eyink et al. | 438/46 |
| 7,687,799 B2* | 3/2010 | Hudait et al. | 257/14 |
| 7,750,425 B2* | 7/2010 | Forrest et al. | 257/441 |
| 7,795,694 B2* | 9/2010 | Song et al. | 257/417 |
| 7,816,701 B2* | 10/2010 | Kim | 257/98 |
| 7,888,857 B2* | 2/2011 | Choi et al. | 313/503 |
| 7,915,604 B2* | 3/2011 | Shields | 257/9 |
| 7,977,666 B2* | 7/2011 | Wang et al. | 257/21 |
| 7,999,272 B2* | 8/2011 | Kim et al. | 257/95 |
| 8,148,186 B2* | 4/2012 | Kovsh et al. | 438/34 |
| 8,334,157 B2* | 12/2012 | Smeeton et al. | 438/47 |
| 2002/0014622 A1* | 2/2002 | Shimoyama et al. | 257/14 |
| 2002/0020892 A1* | 2/2002 | Shima | 257/432 |
| 2002/0050288 A1* | 5/2002 | Suzuki | 136/255 |
| 2002/0074543 A1 | 6/2002 | Petroff et al. | |
| 2002/0114367 A1* | 8/2002 | Stintz et al. | 372/45 |
| 2003/0218143 A1* | 11/2003 | Shields et al. | 250/493.1 |
| 2004/0124409 A1* | 7/2004 | Ebe et al. | 257/14 |
| 2004/0201009 A1* | 10/2004 | Hsu et al. | 257/21 |
| 2005/0041714 A1* | 2/2005 | Kim | 372/50 |
| 2005/0082554 A1* | 4/2005 | Torvik | 257/85 |
| 2006/0049394 A1* | 3/2006 | Snyder et al. | 257/14 |
| 2006/0071218 A1* | 4/2006 | Takeda et al. | 257/79 |
| 2006/0091780 A1* | 5/2006 | Minami | 313/495 |
| 2006/0099825 A1* | 5/2006 | Song et al. | 438/766 |
| 2006/0222028 A1* | 10/2006 | Hatori et al. | 372/45.01 |
| 2006/0227825 A1* | 10/2006 | Kovsh et al. | 372/45.01 |
| 2007/0189348 A1* | 8/2007 | Kovsh et al. | 372/45.01 |
| 2007/0295977 A1* | 12/2007 | Hirose et al. | 257/95 |
| 2008/0079016 A1* | 4/2008 | Kovsh et al. | 257/98 |
| 2008/0142075 A1* | 6/2008 | Reddy et al. | 136/257 |
| 2008/0176030 A1* | 7/2008 | Fonash et al. | 428/119 |
| 2008/0212633 A1* | 9/2008 | Shimizu et al. | 372/45.011 |
| 2008/0308788 A1* | 12/2008 | Ebe et al. | 257/18 |
| 2009/0045394 A1* | 2/2009 | Smeeton et al. | 257/13 |
| 2009/0059982 A1* | 3/2009 | Kamins et al. | 372/43.01 |
| 2009/0095349 A1* | 4/2009 | Forrest et al. | 136/262 |
| 2009/0102083 A1* | 4/2009 | Cochran et al. | 264/40.6 |
| 2009/0242873 A1* | 10/2009 | Pillarisetty et al. | 257/24 |
| 2009/0267049 A1* | 10/2009 | Cho et al. | 257/13 |
| 2009/0305442 A1* | 12/2009 | Ebe et al. | 438/22 |
| 2010/0006143 A1* | 1/2010 | Welser | 136/255 |
| 2010/0074293 A1* | 3/2010 | Lochmann et al. | 372/45.012 |
| 2010/0112742 A1* | 5/2010 | Lee et al. | 438/47 |
| 2010/0260223 A1* | 10/2010 | Kim et al. | 372/45.01 |
| 2010/0289061 A1* | 11/2010 | Matsukura | 257/189 |
| 2011/0233521 A1* | 9/2011 | Saxler | 257/24 |

FOREIGN PATENT DOCUMENTS

| | | |
|---|---|---|
| EP | 1 507 293 A1 | 2/2005 |
| GB | 2 353 635 | 2/2001 |
| GB | 2 367 690 | 4/2002 |
| JP | 2000-188443 | 7/2000 |
| JP | 2005-79182 | 3/2005 |
| JP | 2007-123731 | 5/2007 |
| JP | 2007-227744 | 9/2007 |
| JP | 2008-244470 | 10/2008 |
| JP | 2008-277563 | 11/2008 |
| WO | WO 02/09188 A1 | 1/2002 |
| WO | WO 2006/017220 A1 | 2/2006 |
| WO | WO 2008/094311 A2 | 8/2008 |
| WO | WO 2008/094311 A3 | 8/2008 |

OTHER PUBLICATIONS

K. Hennessy, et al., "Positioning photonic crystal cavities to single InAs quantum dots", Photonics and Nanostructures—Fundamentals and Applications 2, 2004, pp. 65-72.

P. Gallo, et al., "Integration of site-controlled pyramidal quantum dots and photonic crystal membrane cavities", Applied Physics Letters 92, 263101, 2008, 3 pages.

C. Schneider, et al., "Single photon emission from a site-controlled quantum dot-micropillar cavity system", Applied Physics Letters 94, 111111, 2009, 3 pages.

R. E. Pritchard, et al., "Optical characterization of GaAs pyramid microstructures formed by molecular beam epitaxial regrowth on pre-patterned substrates", Journal of Applied Physics, vol. 90, No. 1, Jul. 2001, pp. 475-480.

P. Atkinson, et al., "Gallium-assisted deoxidation of patterned substrates for site-controlled growth of InAs quantum dots", Journal of Crystal Growth 311, 2009, pp. 1815-1818.

T. J. Pfau, et al., "High optical quality site-controlled quantum dots", Microelectronic Engineering, 2010, 3 pages.

H. Heidemeyer, et al., "Highly ordered arrays of In(Ga)As quantum dots on patterned GaAs(001) substrates", Journal of Crystal Growth 261, 2004, pp. 444-449.

United Kingdom Search Report Issued Sep. 27, 2010, in Great Britain Patent Application No. 1007802.0, filed May 10, 2010.

Office Action issued Jul. 3, 2012 in Japanese Patent Application No. 2011-104945 (with English translation).

* cited by examiner

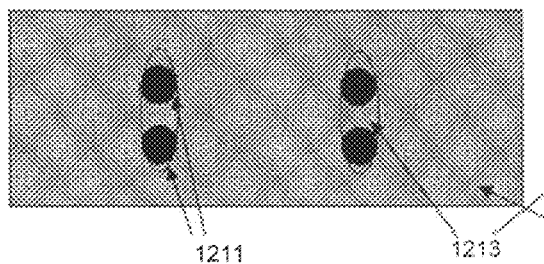
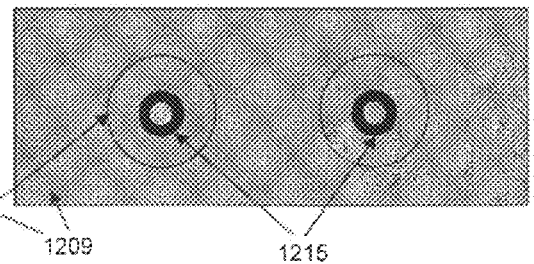
Figure 4b
Figure 4c
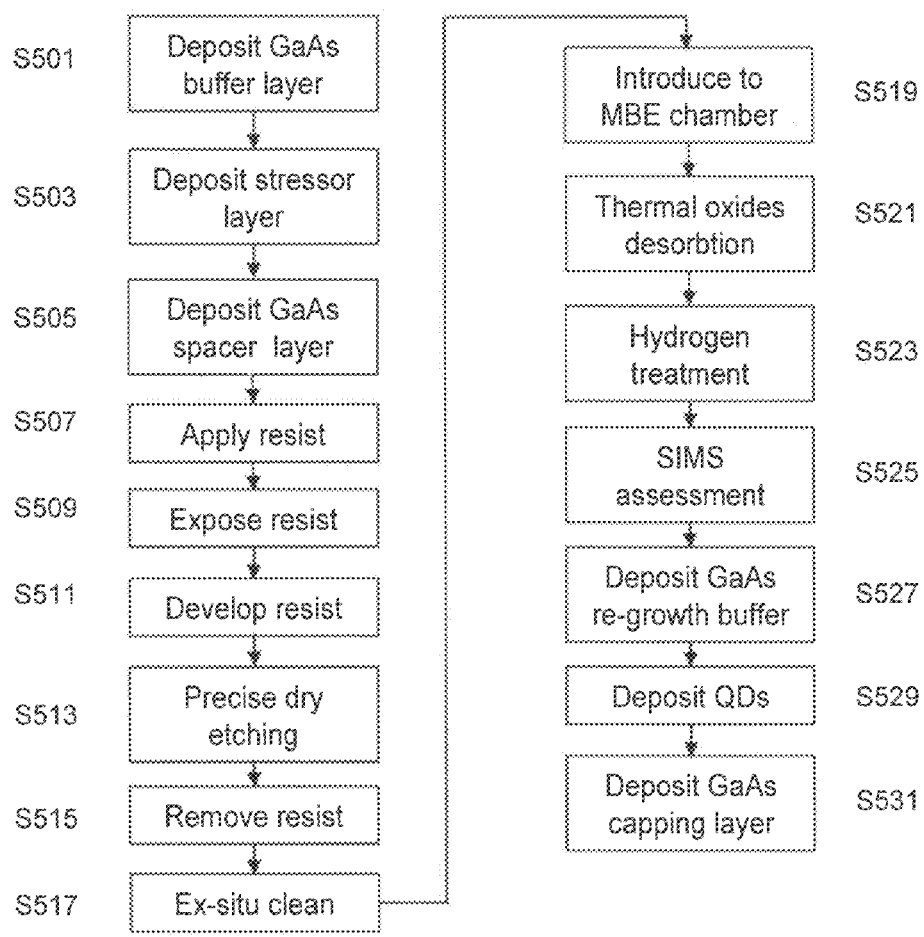
Figure 5

SEMICONDUCTOR DEVICE AND A METHOD OF FABRICATING A SEMICONDUCTOR DEVICE

CROSS REFERENCE TO RELATED APPLICATIONS

This application is based upon and claims priority from United Kingdom Patent Application No. 1007802.0 filed on May 10, 2010, the entire contents of which are hereby incorporated by reference.

FIELD

Embodiments described herein relate to the field of semiconductor devices comprising quantum structure such as quantum dots, rings and wires and their fabrication methods.

BACKGROUND

Quantum dots are provided in many semiconductor devices, for example they are found in single photon sources both electrically an optically driven sources, quantum memory registers and quantum detectors. Recently quantum dot based devices are being used for conventional lighting units due to their ability to produce radiation over a range of frequencies.

A popular technique for the formation of quantum dots in semiconductor devices is to form a few monolayers of one material on another material with a different lattice constant. A particularly popular material system is InAs quantum dots on a GaAs layer.

BRIEF DESCRIPTION OF THE DRAWINGS

The present invention will now be described with reference to the following non-limiting embodiments in which:

FIG. 4 shows the device in accordance with a further embodiment of the present invention where the pits extend through a stressor layer, FIG. 4b shows a plan view with elongated pits and FIG. 4c shows a plan view with symmetric pits.

FIG. 5 is a flowchart showing a processing method in accordance with a preferred embodiment of the present invention;

DETAILED DESCRIPTION

Figure 1:
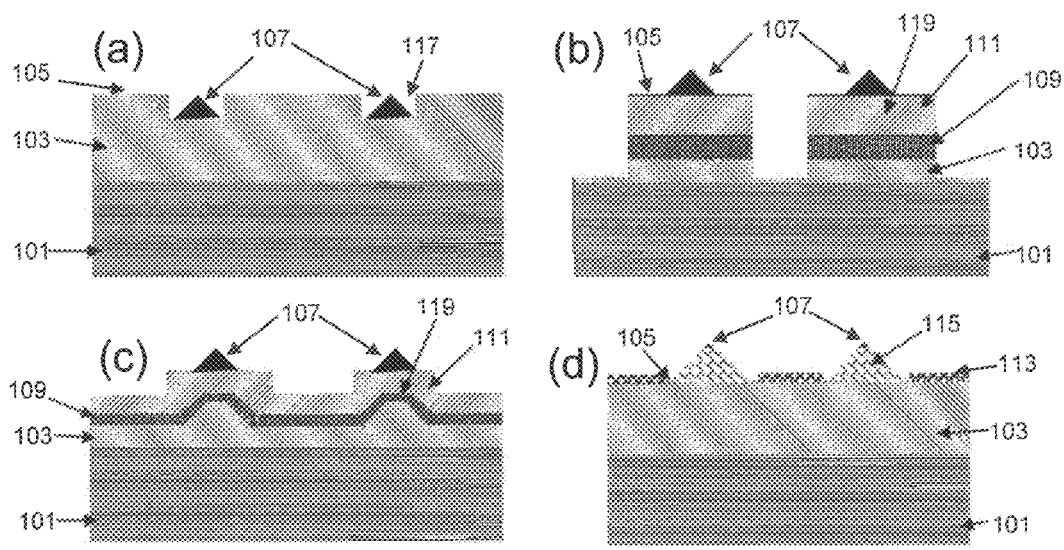
FIGS. 1a, b, c and d show semiconductor devices which have quantum dots positioned in accordance with known techniques.

Devices in accordance with embodiments of the present invention, position quantum structures using a combination of a low potential energy due to the formation of the pits and stress induced by the stressor layer. Pits with a stressor layer underneath act as a sink for re-growth adatoms providing better control over pit occupancy and dot uniformity.

In an embodiment, the quantum structure will generally be a quantum dot, but it is also possible to align quantum rings and quantum wires using the above technique.

Devices in accordance with embodiments of the present invention may be configured as single photon source comprising positioned dots based on a cavity surrounded by distributed bragg reflectors (DBRs); laser based on a cavity surrounded by DBRs; quantum detectors comprising positioned dots; quantum memory registers comprising positioned dots and single photon source comprising positioned dots based on H1 photonic crystal cavity.

In an embodiment, the stressor layer has a substantially different lattice constant to the first layer. The first layer may be a substrate or a spacer layer overlying a substrate. The first layer will typically be the layer which represents the lattice constant for the non-strained or stressed layers of the device. Typically, the lattice mismatch between the first layer and the stressor layer should be between 3-8%. If the stressor layer is InAs and the first layer is GaAs, normally there is 7% lattice mismatch between the two layers. Ga can be added to an InAs stressor layer. In this case, the lattice mismatch will be less but still it will be large enough to act as a stressor layer.

In an embodiment, said first layer comprises GaAs, the stressor layer comprises In(x)Ga(1-x)As and the quantum dot comprises InAs, wherein the In concentration in InGaAs stressor layer is in range of x=0.2-1

For the avoidance of doubt as used herein, the term "overlying" will be used to denote that a layer is formed on the opposite side of another layer to the substrate or it is formed later during the growth process. A first layer overlying a second layer is not necessarily in contact with the second layer, other layers may be provided in between.

The stressor layer has a thickness of at least 1 nm. More preferably its thickness is less than 50 nm. In a preferred embodiment, the stressor layer has a thickness from 2 to 20 nm.

The pits may be formed by wet etching or dry etching. Dry etching allows the lateral dimensions of the pit to be more carefully controlled. In one embodiment, the pit has a lateral dimension below 300 nm. In a further embodiment, the pit has a depth of 5 nm-100 nm. These two embodiments may be combined. In one embodiment, the pit extends through the patterned layer and into the stressor layer.

To produce a good interface for the formation of the quantum dots, preferably, a regrowth buffer layer is provided overlying and in contact with said patterned layer. Preferably, said buffer layer has a thickness of 100 nm or less.

A capping layer is preferably provided overlying said quantum dot. Said capping layer will typically have the same lattice constant as that of the first layer.

In a further embodiment, said patterned layer comprises a plurality of pits and a plurality of quantum dots aligned with said pits. This allows an array to be formed in one or two dimensions.

In a further embodiment, the device further comprises a plurality of quantum dot layers, where the quantum dots are aligned in the direction of growth. Thus, the quantum dots form a plurality of columns. Preferably any layer provided between the quantum dot layers should have a thickness of 40 nm or less.

An electrically activated device may be provided where the stressor layer, the patterned layer and the dot are between doped semiconductor layers providing electrical contacts.

The present invention may be configured as a photon source, said device comprising a p-i-n structure where a p-type doped layer is provided on one side of the quantum dot and an n-type doped layer is provided on the other side of the quantum dot, the device further comprising electrical contacts to said n and p type layers and a source connected to said contacts such that a field may be applied across said quantum dot.

The photon source may be a single photon source having a single active quantum dot or may be configured to output a plurality of photons. Such a photon source would have a plurality of quantum dots.

In a further embodiment, the device further comprises an optical cavity, wherein said cavity provides optical confinement in a direction perpendicular to the plane of the layers, said pit being provided at an antinode in said cavity. The ability to accurately position the quantum dot allows a 3D optical cavity to be aligned to said quantum dot. Such a cavity may be a photonic band-gap cavity.

In a further embodiment, said device is configured as a detector, said device comprising a p-i-n structure where a p-type doped layer is provided on one side of the quantum dot and an n-type doped layer is provided on the other side of the quantum dot, the device further comprising electrical contacts to said n and p type layers and a measurement unit connected to said contacts such that a current may be measured.

Devices in accordance with an embodiment of the present invention may also be configured as a quantum register. In this embodiment, the device further comprises a plurality of gates, wherein each gate is provided overlying a column of dots, wherein a column of dots is provided by a plurality of dots aligned in the growth direction. The quantum register may then be operated as described in A. Balandin et al., Electronic materials, 29, 549-553 (2000).

In an embodiment, the present invention provides a method of positioning quantum dots in a semiconductor device, the method comprising:
  forming a first layer;
  forming a stressor layer overlying said first layer, wherein said stressor layer has a substantially different lattice constant to said first layer,
  forming a further layer and patterning said further layer with at least one pit to form a patterned layer, wherein said pit is located at a position where it is desired to form a quantum dot; and
  forming a dot layer comprising m monolayers or less, said dot layer comprising a material which can form self assembled quantum dots on a layer which is it overlying and in contact with, where m is 5, said quantum dot layer forming a quantum dot in said pit.

In an embodiment m is 1.6-1.7 monolayers.

The patterning may be performed using a dry etching technique. However, wet etching could also be used. The formation of the layers may be by molecular beam epitaxy (MBE) or metal-organic vapour phase epitaxy (MOVPE).

The ability to accurately set the position of the quantum dots allows the quantum dots to be carefully aligned in a structure. For example, they can be formed in the middle of a pillar cavity where the pillar is etched after the layer structure has been formed. The quantum dots may also be positioned accurately for the formation of contacts and the like. Thus, in an embodiment, it is possible to align a further pattern with said pit after the formation of said quantum dot and etch said further pattern aligned with said pit.

FIG. 1a is a semiconductor device using a known method for positioning quantum dots. The device comprises a substrate 101 which is overgrown with a buffer 103. The structure is then patterned and etched using known techniques to form nanoholes or pits 117. These pits are etched into the surface 105 of buffer layer 103.

A layer of quantum islands/dots 107 are then formed overlying the surface 105. The quantum dots 107 are preferentially nucleated inside the pits 117. In a further improvement, the quantum dots are separated from the regrowth interface/surface 105 by a thin regrowth buffer (not shown).

The above method can be applied to both GaAs (001) and GaAs (111) B substrate. The pits can be dry or chemically wet etched resulting in various pit shapes.

FIG. 1b shows a further known method for positioning a quantum dot in a semiconductor device. The technique of FIG. 1b uses strain to position the quantum dot.

As for FIG. 1a, a substrate 101 is formed and a buffer layer 103 is formed overlying the substrate 101. A stressor layer 109 is formed overlying the buffer layer 103 and a spacer layer 111 is formed overlying the stressor layer 109.

The structure is then patterned with an array of mesas 119 and overgrown with a layer of dots 107. The dots preferentially grow on the top of the mesas 119 due to strain caused by the stressor layer 109.

FIG. 1c shows a further semiconductor device fabricated using a known method for positioning quantum dots. As for FIGS. 1a and 1b, a buffer layer 103 is grown overlying a substrate 101. The buffer layer is then patterned with an array of mesas 119 to form an array of bumps. The structure is then overgrown with stressor layer 109 followed by a spacer layer 111. The strain distribution caused by the overlying of stressor layer 109 on an undulating lower layer causes the quantum dots 107 to nucleate on the top of patterned mesas 119.

FIG. 1d shows a further semiconductor device using a known method for positioning the quantum dots. Again, a buffer layer 103 is formed overlying a substrate 101. An oxide 113 is then positioned on the surface of buffer layer 103. The oxide is patterned with arrays of relatively large squares 105. The area where the oxide is removed is overgrown with buffer material forming pyramids 115. The pyramids are not completed meaning that the growth stops before the apex of the pyramid is formed. Quantum dots 107 are positioned on the top of the pyramids 115.

Figure 2:
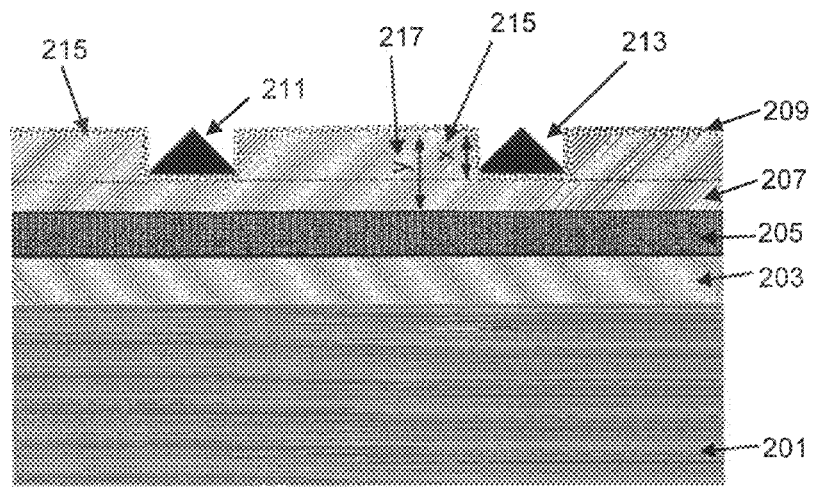
FIG. 2 shows a semiconductor device in accordance with a first embodiment of the present invention.

FIG. 2 is a schematic of a semiconductor device in accordance with an embodiment of the present invention.

The structure comprises a substrate 201. In this particular embodiment, a GaAs substrate, typically 300 μm or 500 μM is used. Buffer layer 203 of is formed overlying and in contact with said substrate. Buffer layer 203 comprises approximately 500 nm of GaAs. This buffer layer is formed to match epitaxially grown layers to the substrate and to keep the substrate/buffer interface relatively far away from the quantum dots. In this embodiment, the growth temperature and As overpressure needs to stay the same for all the following layers.

Stressor layer 205 is formed overlying and in contact with said buffer layer. Stressor layer 205 comprises approximately 2-20 nm of InGaAs. The In concentration is approximated to be in range 20-100%. The lattice constant of the stressor layer is increased by adding In. At the same time the stressor layer needs to be thick enough to form an even layer.

Spacer layer 207 is then formed overlying and in contact with said stressor layer 205. The spacer layer comprises GaAs. The spacer layer is patterned by means of electron beam lithography and dry etching to form an array of pits 213. The spacer layer 207 becomes a patterned layer.

The thickness of the spacer layer is important as it sets how deep the pits may be made. If the depth of the etch of the pits can be controlled to 50 nm, then the thickness of the spacer layer 207 can be designed to be 70 nm. Thus for these values, there will be 20 nm GaAs between the bottom of the pit and the stressor layer.

In this embodiment, the quantum structures will be quantum dots. Good quality dots cannot be formed directly on the re-growth interface (the etched surface). Therefore re-growth buffer layer 209 which may be as thin as 15 nm of GaAs is formed. Such a buffer layer has been shown to provide high intensity photoluminescence of the re-grown dots.

In this embodiment, the thickness of the spacer layer minus the depth of the etch pits should be minimised. In other words, y−x should be minimal.

Quantum dots 211 are then formed by growing 1.6 monolayers of InAs at a growth rate 0.009 ML/sec. The V/III flux ratio used during the growth is ~800. Here, the bottom of the pits will be strained due to the proximity of the stressor layer 205. This will cause the pits 213 to act as a sink for InAs sucking InAs adatoms on the surface of the regrowth buffer layer 209. It should be noted that the adatoms on the surface of the regrowth buffer layer 209 which overlies the non-etched parts of spacer layer 207 will feel significantly less strain since they are further away from the stressor layer 205. The higher the growth temperature, the larger the migration length of the InAs adatoms. The distance between the neighbouring pits can be extended keeping the probability of the dot formation on the non etched surface close to zero. For the above, the growth temperature should be ~480 C.

Figure 3:
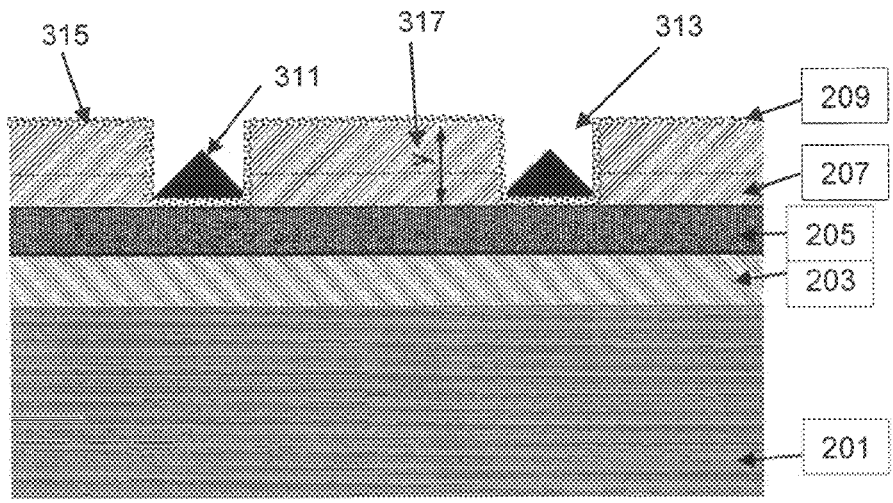
FIG. 3 shows a semiconductor device in accordance with a second embodiment of the present invention where the pits extend down to a stressor layer.

FIG. 3 shows a further embodiment of the present invention.

To avoid any unnecessary repetition, like reference numerals will be used to denote like features. The layer structure of FIG. 3 is the same as the layer structure of that for FIG. 2. However, the spacer layer 207 is etched down to the top of stressor layer 205. In other words, y−x=0 and the dots are separated from the stressor layer only by the re-growth buffer.

This layer is then overgrown with regrowth buffer layer 209. The quantum dots 311 are formed in the same manner as described with reference to FIG. 2.

The main difference between FIGS. 2 and 3 is the proximity to the stressor layer. FIG. 3 shows the case when the dots are separated from the stressor layer only by the re-growth buffer. In FIG. 3, the top of the stressor layer 205 is the re-growth interface.

There are two competing requirements. The quality of the quantum dots improves the closer they are formed to the stressor layer. However, material systems which are typically used for stressor layers are often degraded in the cleaning processes used for preparing the regrowth interface for further growth.

For example, if a stressor layer comprises 100% in content, the quality of the stressor layer will be significantly degraded as the layer will be attacked by the chemicals used to prepare the re-growth interface before transferring the wafer to the MBE chamber. Indium is especially sensitive to any chemical treatment.

Some of the ex-situ cleaning procedures rely on oxidation of the re-growth interface surface and then removal of the formed oxides. Each oxidation removes ~2 nm of the surface material. Thus, even if a few nm of GaAs is left on the top of the stressor layer there is a chance that this GaAs will be removed by oxidation during cleaning procedure. However, the closer to the stressor layer the dots are formed the better they are: more uniform.

FIG. 4 shows a yet further variation on the device of FIG. 2. To avoid any unnecessary repetition, like reference numerals will be used to denote like features.

In this embodiment, the quantum structures may be either quantum dots or rings. The layer structure of the device before patterning is the same as that described with reference to FIG. 2. However, in FIG. 4, the pits 413 are etched using wet chemical etching resulting in a conical shape of pits 413. In addition, the pits are etched below the stressor layer 205.

The pattern structure is then overgrown with regrowth buffer layer 209. The dots are then formed in the pits 413. However, due to the shape of the pits, the dots are not formed in the apex of the pits but on the sidewalls in close proximity to the stressor layer 205.

Figure 4A:
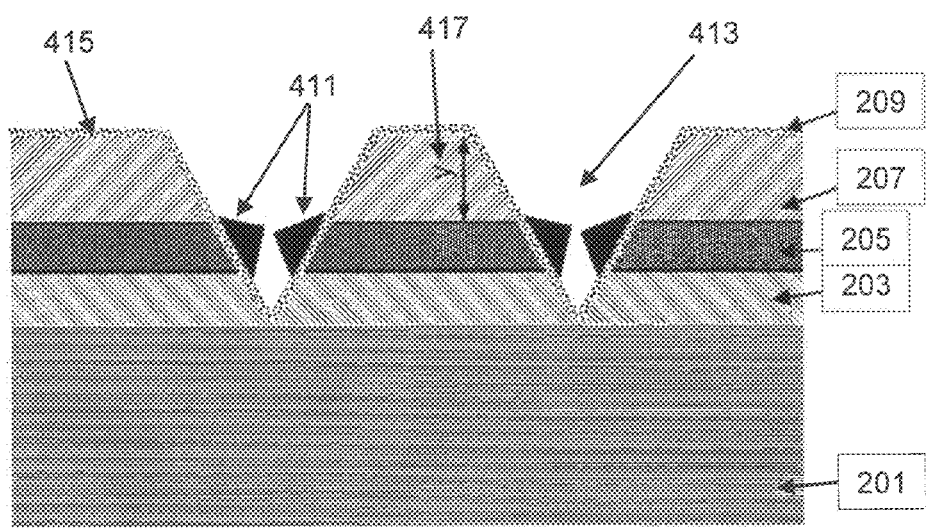
FIG. 4a is a cross section through the layer structure.

FIG. 4b shows a plan view of the device of FIG. 4a where the pits 1213 have been elongated. This shape causes a plurality of quantum dots 1211 to be formed, in this case 2, in each pit 1213.

In FIG. 4c, a further plan view of a device with the structure of FIG. 4a is shown. In the plan view of FIG. 4c, the pits are symmetric and etched down below the stressor layer. In this situation, an attempt to grow quantum dots and form quantum rings 1215 as shown in FIG. 4c.

FIG. 5 shows in detail a flowchart of the fabrication steps to make the devices described with reference to FIG. 2. First, a GaAs buffer is formed on a substrate in step S501. The buffer layer will have a thickness of approximately 500 nanometers. A stressor layer is then formed overlying and in contact with said buffer layer in step S503. The stressor layer will generally comprise 2-20 nm of InGaAs. The In concentration is approximated to be in range 20-100%. GaAs spacer layer is then formed overlying said stressor layer in step S505. The GaAs spacer layer will have a thickness set by the desired depth of the pattern which will be formed on the layer as described with reference to FIG. 2.

The GaAs spacer layer is then patterned by first supplying resist in step 507. In general, the patterning will take place using electron beam lithography as this allows patterning of very small features. Typically, the pits to be occupied with single dots will have a diameter varying from 20 nm to 100 nm.

In step S509, the resist exposed using e-beam lithography. Although photo-lithography could also be used where a pattern is applied to the resist through a photolithographic mask. It is difficult to form features of the above size with photo-lithography. Therefore, electron beam lithography is generally used.

The resist is then developed in step S511 and the structure is etched in S513. To produce the structures of FIGS. 2 and 3, dry etching is used.

Typically, the pits will be etched to be 50 nm deep. On this scale it is difficult to determine if the sidewalls of the pits are truly vertical. A dry etch is preferably used as this allows the lateral dimension of the pit to be controlled and kept below 100 nm.

The resist is removed in step S515 and the structure is ex-situ cleaned using cleaning techniques suitable for cleaning a wafer for re-entry into a molecular beam epitaxy chamber. Such techniques may involve oxygen ashing in addition to chemical cleaning.

The structure will then be reintroduced into a MBE chamber in step S519 and in order to ensure that the structure is clean enough for further growth, the structure will be heated to allow thermal oxide desorption in step S521.

The structure will then be hydrogen cleaned in step S523 and to ensure that the structure is clean enough, a SIMS (Secondary Ion Mass Spectroscopy) assessment will be performed in step S525 on the wafer surface.

Once it has been determined that the wafer has been sufficiently cleaned, a GaAs regrowth buffer having a thickness of approximately 15 nm is formed in step S527.

Quantum dots are then formed using 1.6 monolayers of InAs in step S529 as described with reference to FIG. 2. Finally, GaAs capping layer is deposited in step S531. The thickness of the capping layer is not of great importance. Typically 275 nm is deposited. This thickness is used as it allows a lambda cavity on the air/semiconductor interface to be formed using the assumption that the dots emit at ~950 nm (the refractive index of GaAs is: 3.509).

Figure 6:
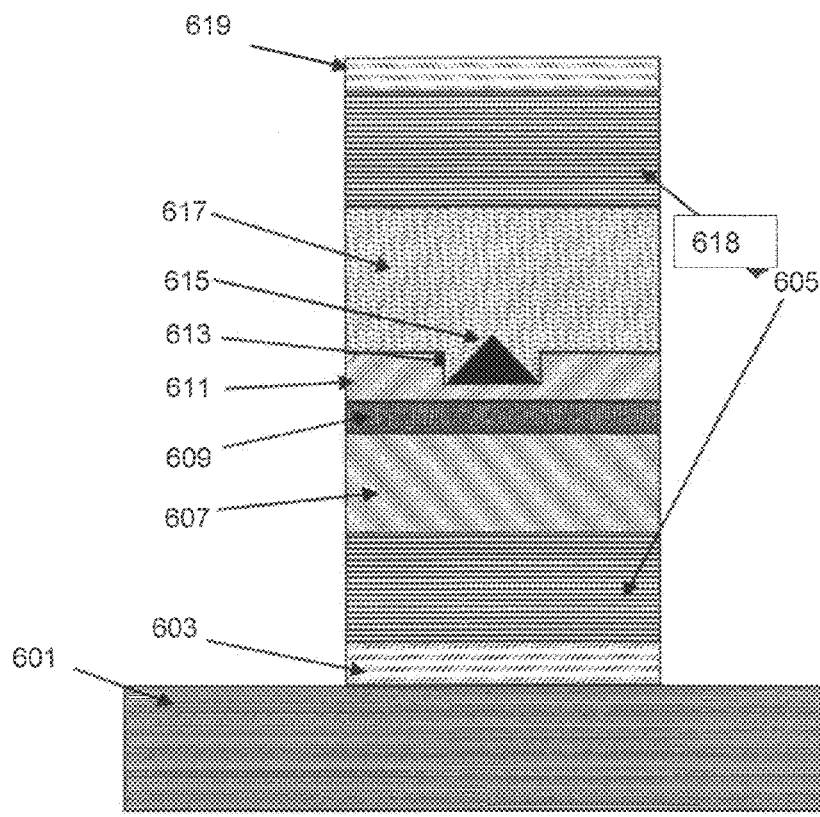
FIG. 6 is a single photon source in accordance with an embodiment of the present invention.

FIG. 6 shows a single photon source structure using the fabrication techniques described with reference to FIGS. 2 to 5.

The structure is formed on a substrate 601. In this particular example, the structure is a GaAs substrate. Overlying and in contact with said substrate 609 is an n-doped buffer layer 603. The n-doped buffer layer 603 will comprise GaAs. Overlying and in contact with said buffer layer is lower distributed Bragg reflector 605. Lower distributed Bragg reflector will comprise alternating layers GaAs and AlAs.

Next, the cavity is formed. The lower layer of the cavity is stressor layer 609 which comprises 2 to 20 nm nanometers of InGaAs. A spacer layer 611 comprising GaAs is then formed overlying and in contact with said stressor layer 609.

The spacer layer 611 is then patterned as described with reference to FIGS. 2, 3 and 5 to form an array of pits 613.

The structure is then cleaned and a regrowth buffer layer (not shown) is formed overlying said spacer layer 611. Quantum dots are then formed overlying said spacer layer in the manner described with reference to FIGS. 2, 3 and 5.

The cavity and the distributed Bragg reflectors are designed to operate at a certain wavelength that stays in agreement with the dot emission. The structure is etched to form micro-pillars for the mode lateral confinement.

The quantum dot 615 is positioned at the anti-node of the cavity electric field and in the centre of the pillar.

A GaAs capping layer 617 is then formed overlying and in contact with said regrowth buffer layer and quantum dot 615. The capping layer 617 provides the top layer of cavity. Overlying and in contact with said capping layer is upper DBR which comprises repeating layers of GaAs/AlGaAs. Finally, a p-doped layer 619 is formed overlying and in contact with said upper DBR 618. The structure is therefore a p-i-n structure. It will not be shown here, but a p-type contact can be made to the top of the pillar and a n-type contact to layer 603. This allows an electric field to be applied perpendicular to the growth direction.

The operation of such a single photon source has been described previously in GB2380605 of CRLs earlier patterns. Such a source may be electrically or optically excited.

Figure 7:
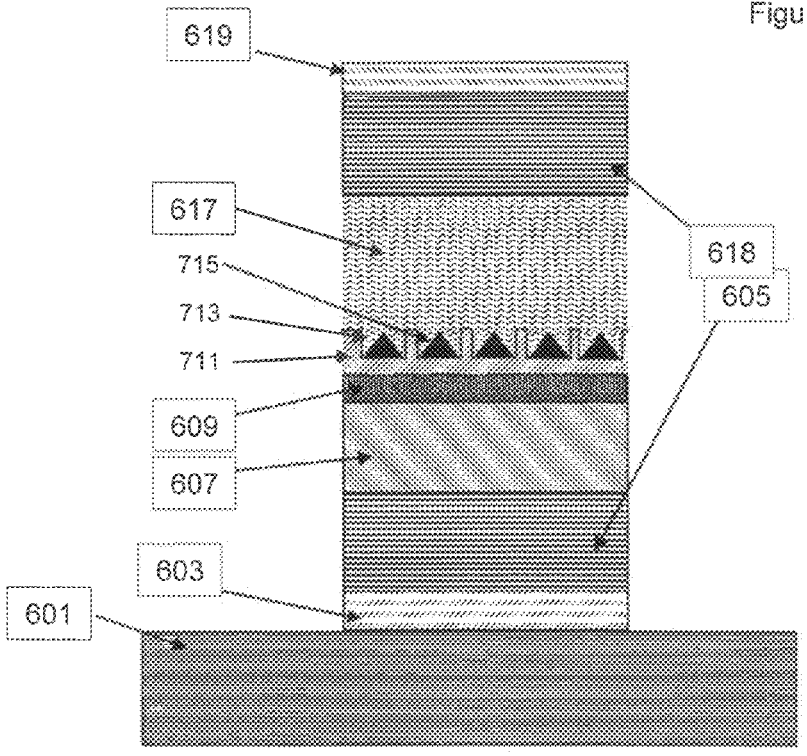
FIG. 7 is a laser structure in accordance with an embodiment of the present invention.

FIG. 7 is a schematic of a laser comprising a plurality of quantum dots formed in the above manner. In a laser structure, the dots do not need to be aligned. However, it is beneficial to keep uniform dot density within the structure, and keep other optical properties such as wavelength constant.

The structure is similar to that described with reference to FIG. 6. Therefore, to avoid any unnecessary repetition, like reference numerals will be used to denote like features. Spacer layer 711 is formed overlying and in contact with stressor layer 609. Spacer layer 711 is patterned as described with reference to FIG. 5 to form a plurality of pits 713. A plurality of quantum dots 715 are then formed with each dot in a pit 713.

A GaAs capping layer 617 is then formed over said patterned dot layer 715. The rest of the structure proceeds in the same manner as described with reference to FIG. 6.

As for FIG. 6, the contacts 603 and 619 allow an electric field to be applied perpendicular to the growth direction.

The structure when completed comprises a plurality of quantum dots.

Figure 8:
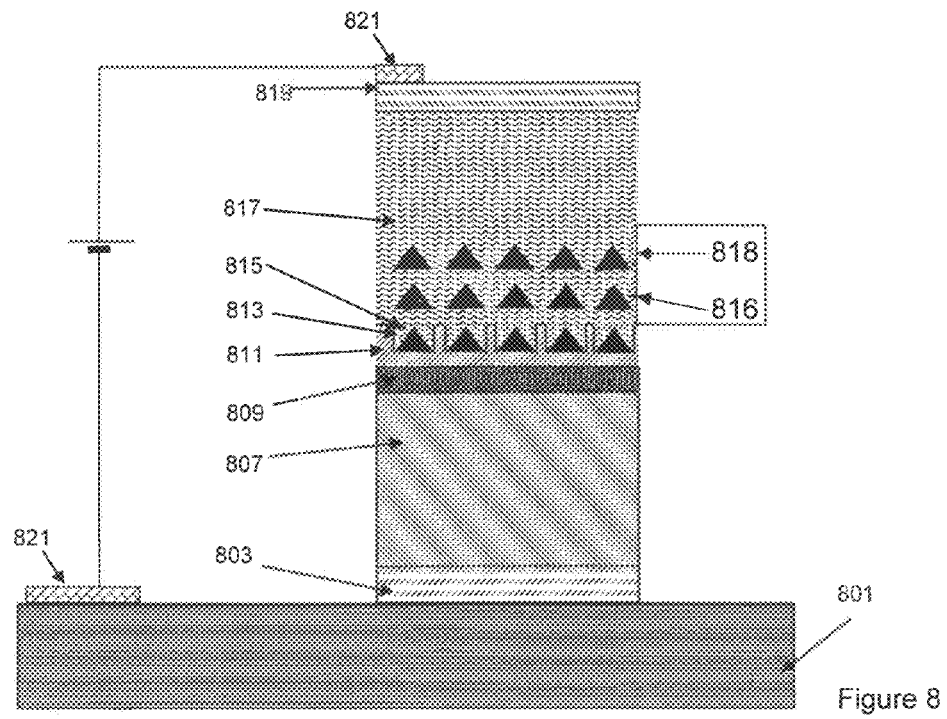
FIG. 8 is a photo detector device in accordance with an embodiment of the present invention.

FIG. 8 shows a schematic of a device fabricated in accordance with an embodiment of the present invention as a detector.

The structure is formed on a substrate 801. In this example, substrate 801 is GaAs. An n-doped buffer layer 803 is then formed overlying and contact with said substrate 801. Next, bottom cavity layer 807 is formed which comprises GaAs. Stressor layer 809 is then formed overlying and contact with bottom cavity layer 807.

Spacer layer 811 is then formed overlying and in contact with stressor layer 809. Spacer layer 811 is then patterned to form a plurality of pits 813. The structure is then cleaned as described with reference to FIG. 5. A regrowth buffer layer (not shown) is formed and then quantum dots are formed in pits 813. A GaAs cap layer is then formed overlying and in contact with said first layer of quantum dots 815.

After a layer of GaAs, a second quantum dot layer 816 is formed. Due to the position of the pits 813, the quantum dots in second dot layer 816 align with the quantum dots 815 and the first dot layer. The GaAs cap layer then resumes and a third layer of quantum dots 818 is formed which again aligns automatically with the further two layers of quantum dots. Continual layers of quantum dots may be formed all of which will be in alignment.

For the dots to be vertically aligned the thickness of the GaAs spacer between them should not be more than 40 nm. In this way it is possible to continually create dot layers which will remain vertically aligned.

The GaAs cap layer 817 then continues and the structure is finished with p-doped GaAs layer 819. A contact 821 is made to n-type substrate 801 and a p-type contact 821 is provided to p-type layer 819.

An electric field is then applied across the quantum dot. In a simple mode of operation when a photon is absorbed by a quantum dot, an electron and hole pair is excited in the quantum dot which then separate towards the n and p-type contacts. Therefore, when photons are incident on the device, a current flows.

Figure 9:
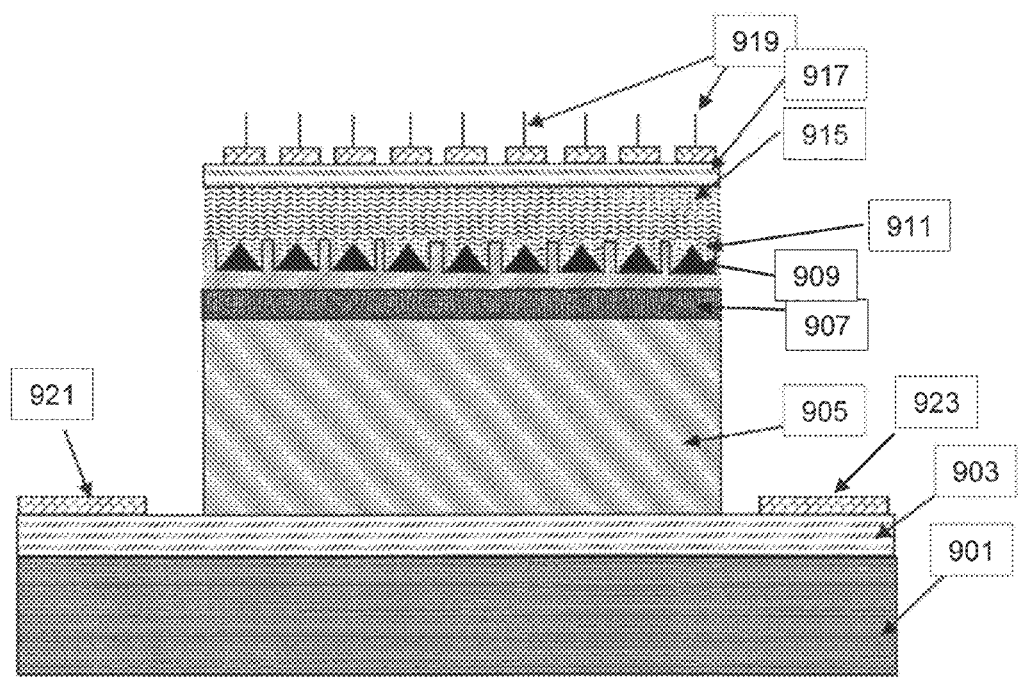
FIG. 9 is a quantum register based device in accordance with the present invention.

FIG. 9 shows a quantum register device in accordance with an embodiment of the present invention. The register device comprises a single layer of quantum dots as described with reference to FIG. 7.

The proposed register could be used as a memory unit or logic unit for quantum computing. The information could be written to the dots, stored then read when necessary.

The register device comprises a GaAs substrate. Overlying and in contact with said GaAs substrate is n-type GaAs layer 903.

Lower cavity layer 905 is formed overlying and in contact with said n-doped buffer layer 903. Lower cavity layer 905 comprises GaAs.

Stressor layer 907 is formed overlying and in contact with said lower cavity layer 905. Spacer layer 909 is then formed overlying and in contact with stressor layer 907. Spacer 909 is then patterned to form a plurality of pits 911 as described with reference to FIG. 8 and FIG. 5.

First quantum dot layer 912 is then formed such that said quantum dots form in said pits 911.

GaAs cap layer 915 is then formed overlying and in contact with said first quantum dot layer 912. The GaAs cap layer continues until it reaches p-doped layer 917. A plurality of contacts 919 are then made to p-doped layer 917. A plurality of gates 919 are provided to align with the pits and hence the quantum dots. The gates are Schottky gates which allow manipulation of the confined electron levels in a single quantum dot.

Contacts 921 and 923 are two separate contacts which act as a source and drain.

The principles of such a register are taught in A. Balandin et al., Electronic materials, 29, 549-553 (2000).

Figure 10:
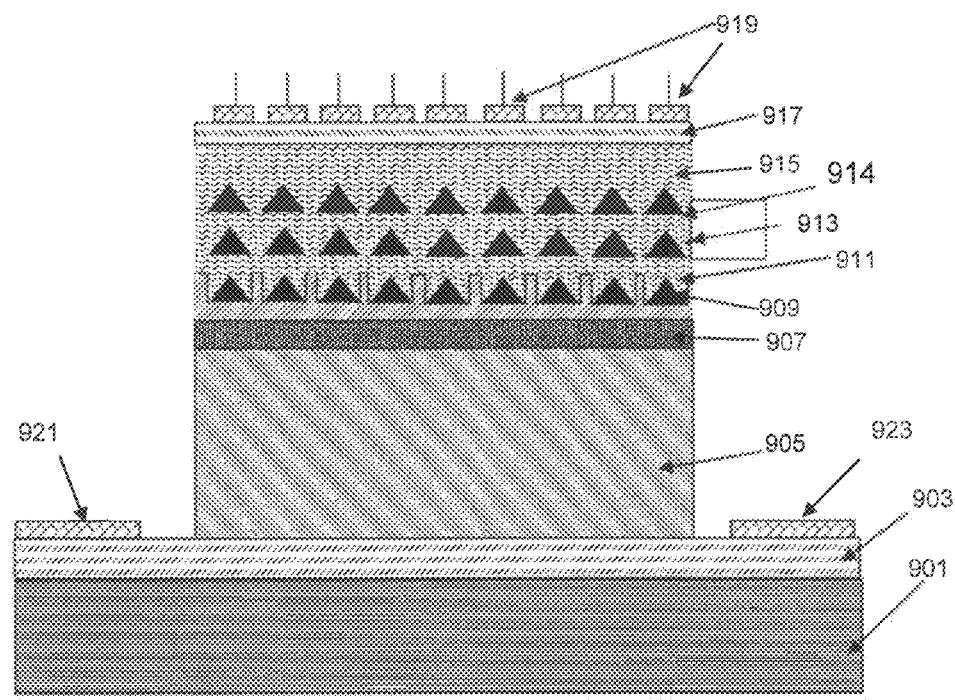
FIG. 10 is a further quantum register device in accordance with an embodiment of the present invention.

FIG. 10 shows a multiple layer version of FIG. 9 where a plurality of layers of aligned quantum dots are formed. To avoid any unnecessary repetition, like reference numerals will be used to denote like features.

In the device of FIG. 10, First quantum dot layer 912 is formed such that said quantum dots form in said pits 911. GaAs cap layer 915 is then formed overlying and in contact with said first quantum dot layer 912. The growth of this GaAs cap layer 915 is then stopped to form second quantum dot layer 913, after formation of the second quantum dot layer 913 the growth of GaAs cap layer 915 continues. The growth of the cap layer is then interrupted once more to form third quantum dot layer 914. The first, second and third quantum dot layers are aligned due to their proximity to the pits 911 and stressor layer 907.

Figure 11:
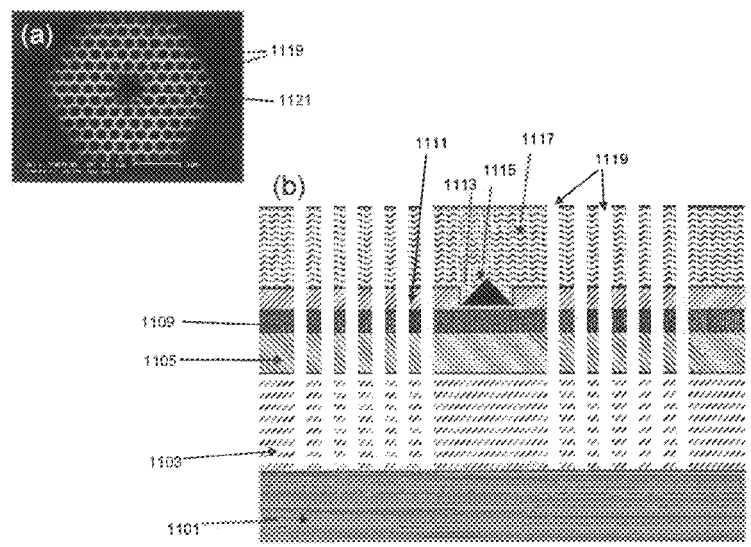
FIG. 11 shows a further example of a single photon source in accordance with an embodiment of the present invention.

FIG. 11 shows a further example of a photon source in accordance with an embodiment of the present invention. FIG. 11a shows a plan view of the structure whereas FIG. 11b shows a cross-section.

The structure is formed on substrate 1101. Overlying and in contact with said substrate is sacrificial layer 1103. Overlying and in contact with said sacrificial layer 1103 is buffer layer 1105. Overlying and in contact with said buffer layer 1105 is stressor layer 1109. A spacer layer 1111 is formed overlying and in contact with said stressor layer 1109. The spacer layer 1111 is patterned with a pit 1113 as described with reference to the earlier figures. A quantum dot is then formed by MBE and the quantum dot forms in pit. The quantum dot 1115 is then capped with a GaAs capping layer 1117.

The structure is then patterned to form a hexagonal lattice which surrounds a H1 cavity 1121. The lattice is then etched so that air holes 1119 extend through the structure and into sacrificial layer 1103.

By using the above technique, it is possible to precisely position the quantum dot 1115 at the centre of H1 cavity.

Devices in accordance with embodiments of the present invention allow reliable positioning for high quality quantum dots grown on nanoholes etched in a semiconductor structure containing a stressor layer. The dots nucleate only inside the pits due to the double site nucleation mechanism: low potential energy of the sites and strain. Devices in accordance with embodiments of the present invention have the advantage of: allowing precise positioning of the dots; control over the number of the dots nucleated in the nanoholes; controllable optical properties of the dots; and improved uniformity of the dots. Further, devices in accordance with embodiments of the present invention may be easily integrated with other components.

While certain embodiments have been described, these embodiments have been presented by way of example only, and are not intended to limit the scope of the inventions. Indeed the novel devices and methods described herein may be made without departing from the spirit of the inventions. The accompanying claims and their equivalents are intended to cover such forms or modifications and would fall within the scope and spirit of the inventions.

The invention claimed is:

1. A semiconductor device comprising a quantum structure and a plurality of layers, wherein said plurality of layers comprises:

a first layer;
a stressor layer; and
a patterned layer
wherein said stressor layer overlies said first layer and said patterned layer overlies said stressor layer; said stressor layer having a substantially different lattice constant to said first layer, the semiconductor device further comprising a pit provided in at least said patterned layer and wherein the quantum structure is provided in said pit, wherein said patterned layer is a layer which has been patterned after it has been grown.

2. A semiconductor device according to claim 1, wherein said quantum structure is a quantum dot.

3. A semiconductor device according to claim 1, wherein said patterned layer comprises a plurality of pits and a plurality of quantum structures aligned with said plurality of pits.

4. A semiconductor device according to claim 1, further comprising a plurality of layers, each layer comprising a plurality of quantum dots, where the quantum dots are aligned in a direction perpendicular to a plane of the first layer.

5. A semiconductor device according to claim 1, wherein said stressor layer has a lattice constant which differs from the lattice constant of said first layer by 3 to 8%.

6. A semiconductor device according to claim 1, wherein the stressor layer has a thickness of at least 1 nm.

7. A semiconductor device according to claim 1, wherein said first layer comprises GaAs, and the stressor layer comprises In(x)Ga(1-x)As, wherein the In concentration in InGaAs stressor layer is in range of x=0.2-1.

8. A semiconductor device according to claim 1, wherein the stressor layer, the patterned layer and the quantum structure are between doped semiconductor layers providing electrical contacts.

9. A semiconductor device according to claim 1, wherein the pit has a lateral dimension below 300 nm and depth 5 nm-100 nm.

10. A semiconductor device according to claim 1, further comprising a regrowth buffer layer provided overlying and in contact with said patterned layer.

11. A semiconductor device according to claim 1, wherein the pits extend through the patterned layer and into the stressor layer.

12. A semiconductor device according to claim 1, configured as a photon source where said quantum structure is a quantum dot, said semiconductor device comprising a p-i-n structure where a p-type doped layer is provided on one side of the quantum dot and an n-type doped layer is provided on the other side of the quantum dot, the semiconductor device further comprising electrical contacts to said n and p type doped layers and a source connected to said electrical contacts such that a field may be applied across said quantum dot.

13. A semiconductor device according to claim 1, configured as a detector wherein said quantum structure is a quantum dot, said semiconductor device comprising a p-i-n structure where a p-type doped layer is provided on one side of the quantum dot and an n-type doped layer is provided on the other side of the quantum dot, the semiconductor device further comprising electrical contacts to said n and p type doped layers and a measurement unit connected to said electrical contacts such that a current may be measured.

14. A semiconductor device according to claim 3 configured as a register, wherein said quantum structures are quantum dots, further comprising a plurality of gates, wherein each gate is provided overlying a column of dots, wherein a column of dots is provided by a plurality of dots aligned in a direction perpendicular to a plane of the first layer.

15. A semiconductor device according to claim 10, wherein said regrowth buffer layer has a thickness of less than 100 nm.

16. A semiconductor device according to claim 12, further comprising an optical cavity, wherein said cavity provides optical confinement in a direction perpendicular to a plane of the first layer, said pit being provided at an antinode in said cavity.

17. A semiconductor device according to claim 16, wherein said cavity is a photonic crystal defect cavity.

18. A method of positioning quantum dots in a semiconductor device, the method comprising:
   forming a first layer;
   forming a stressor layer overlying said first layer, wherein said stressor layer has a substantially different lattice constant to said first layer,
   forming a further layer and patterning said further layer with at least one pit to form a patterned layer, wherein said pit is located at a position where it is desired to form a quantum dot; and
   forming a dot layer comprising m monolayers or less, said dot layer comprising a material which can form self assembled quantum dots on a layer which is it overlying and in contact with, where m is 5, said quantum dot layer forming a quantum dot in said pit.

19. A method according to claim 18, wherein said patterning is performed using a dry etching technique.

20. A method according to claim 18, further comprising aligning a further pattern with said pit after the formation of said quantum dot and etching said further pattern aligned with said pit.

* * * * *